(12) United States Patent
Kwak et al.

(10) Patent No.: US 10,790,446 B2
(45) Date of Patent: Sep. 29, 2020

(54) ELECTROLUMINESCENT DISPLAY DEVICE

(71) Applicant: LG Display Co., Ltd., Seoul (KR)

(72) Inventors: Jinah Kwak, Paju-si (KR); Sungmoo Kim, Paju-si (KR); Heumell Baek, Paju-si (KR)

(73) Assignee: LG Display Co., Ltd, Seoul (KR)

(*) Notice: Subject to any disclaimer, the term of this patent is extended or adjusted under 35 U.S.C. 154(b) by 0 days.

(21) Appl. No.: 16/207,541

(22) Filed: Dec. 3, 2018

(65) Prior Publication Data

US 2019/0173011 A1 Jun. 6, 2019

(30) Foreign Application Priority Data

Dec. 5, 2017 (KR) .................. 10-2017-0165704

(51) Int. Cl.
H01L 27/32 (2006.01)
H01L 51/50 (2006.01)
H01L 51/56 (2006.01)
H01L 51/00 (2006.01)

(52) U.S. Cl.
CPC ...... H01L 51/0005 (2013.01); H01L 27/3211 (2013.01); H01L 27/3218 (2013.01); H01L 27/3223 (2013.01); H01L 27/3246 (2013.01); H01L 51/5012 (2013.01); H01L 51/56 (2013.01); H01L 2227/323 (2013.01)

(58) Field of Classification Search
None
See application file for complete search history.

(56) References Cited

U.S. PATENT DOCUMENTS

2005/0003569 A1* 1/2005 Seki ................. B41J 25/003
438/30
2009/0109143 A1* 4/2009 Yamazaki ........ H01L 51/0003
345/76

* cited by examiner

Primary Examiner — Herve-Louis Y Assouman
(74) Attorney, Agent, or Firm — Morgan, Lewis & Bockius LLP

(57) ABSTRACT

An electroluminescent display device includes: a substrate, a first pixel column on the substrate, the first pixel column including: a plurality of first pixels configured to emit light of a first color, and a first emission layer, a second pixel column on the substrate, the second pixel column including: a plurality of second pixels configured to emit light of a second color, and a second emission layer, a first bank extending between the first pixel column and the second pixel column, between each of the plurality of first pixels, and between each of the plurality of second pixels, and a second bank extending between the first pixel column and the second pixel column on each first bank.

17 Claims, 10 Drawing Sheets

ELECTROLUMINESCENT DISPLAY DEVICE

CROSS-REFERENCE TO RELATED APPLICATION(S)

This application claims the benefit of and priority to Korean Patent Application No. 10-2017-0165704, filed on Dec. 5, 2017, the entirety of which is hereby incorporated by reference.

BACKGROUND

1. Technical Field

The present disclosure relates to an electroluminescent display device, for example, to an electroluminescent display device having an emission layer formed by a solution process.

2. Discussion of the Related Art

An electroluminescent display device may be provided such that an emission layer is formed between two electrodes. According as the emission layer emits light by an electric field generated between the two electrodes, an image is displayed on the electroluminescent display device.

The emission layer may be formed of an organic material, which emits light when an exciton is produced by a bond of electron and hole, and the exciton falls to a ground state from an excited state. Otherwise the emission layer may be formed of an inorganic material, such as quantum dot.

Hereinafter, an electroluminescent display device according to the related art will be described with reference to the accompanying drawings.

FIG. 1 is a cross-sectional view illustrating an electroluminescent display device according to the related art.

As shown in FIG. 1, an electroluminescent display device according to the related art may include a substrate 10, a circuit device layer 20, a first electrode 30, a bank 40, and an emission layer 50. The circuit device layer 20 is formed on the substrate 10. The circuit device layer 20 includes various signal lines, a thin film transistor, and a capacitor.

The first electrode 30 is formed on the circuit device layer 20. The first electrode 30 is patterned per each pixel, and the first electrode 30 functions as an anode of the electroluminescent display device. The bank 40 is formed in a matrix type, which defines an emission area.

The emission layer 50 is formed in the emission area defined by the bank 40. The emission layer 50 may be formed by a solution process, e.g., using an inkjet apparatus. In case of the related art for the electroluminescent display device, it may have a problem related with non-uniformity of light emission between a pixel in a middle area of the substrate 10 and a pixel in a peripheral area of the substrate 10.

For example, when the emission layer 50 is formed by the solution process, it needs processes of dropping a solution for forming the emission layer 50 onto the emission area, and drying the dropped solution. In this case, it may generate the difference between a drying speed of the solution in the middle area of the substrate 10 and a drying speed of the solution in the peripheral area of the substrate 10. When there is the difference in drying speed, a shape of the emission layer 50 in the pixel provided in the middle area of the substrate 10 may be different from a shape of the emission layer 50 in the pixel provided in the peripheral area of the substrate 10. As a result, a light emission may be not uniform between the pixel provided in the middle area of the substrate 10, and the pixel provided in the peripheral area of the substrate 10.

SUMMARY

Accordingly, embodiments of the present disclosure are directed to an electroluminescent display device that substantially obviates one or more of the issues due to limitations and disadvantages of the related art.

An aspect of the present disclosure is to provide an electroluminescent display device that is capable of maintaining uniformity of light emission between a pixel provided in a central area of a substrate and a pixel provided in a peripheral area of a substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: a substrate, a first pixel column on the substrate, the first pixel column including: a plurality of first pixels configured to emit light of a first color, and a first emission layer, a second pixel column on the substrate, the second pixel column including: a plurality of second pixels configured to emit light of a second color, and a second emission layer, a first bank extending between the first pixel column and the second pixel column, between each of the plurality of first pixels, and between each of the plurality of second pixels, and a second bank extending between the first pixel column and the second pixel column on each first bank.

In another aspect, there is provided an electroluminescent display device, including: a substrate, a first pixel column on the substrate, the first pixel column including a plurality of first pixels configured to emit light of a first color, a second pixel column on the substrate, the second pixel column including a plurality of second pixels configured to emit light of a second color, and a bank extending between the first pixel column and the second pixel column, between each of the plurality of first pixels, and between each of the plurality of second pixels, wherein a height of the bank between the first pixel column and the second pixel column is higher than a height of the bank between each of the plurality of first pixels.

In another aspect, there is provided an electroluminescent display device, including: a substrate including: an active area, and a dummy area, a first column including: a plurality of first pixels in the active area, and a plurality of first dummy pixels in the dummy area, a second column including: a plurality of second pixels in the active area, and a plurality of second dummy pixels in the dummy area, a first emission layer in the first column, and a second emission layer in the second column, wherein the first emission layer has a continuous structure from the active area to the dummy area along an extending direction of the first column, and wherein the second emission layer has a continuous structure from the active area to the dummy area along an extending direction of the second column.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
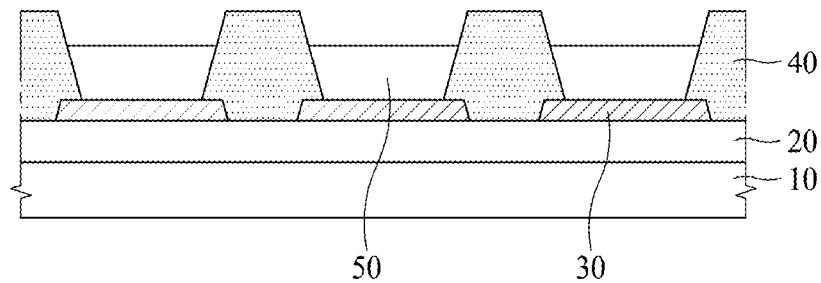
FIG. 1 is a cross-sectional view illustrating an electroluminescent display device according to the related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made for example to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next,"

or "before," a case that is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an electroluminescent display device according to one example embodiment of the present disclosure will be described for example with reference to the accompanying drawings.

Figure 2:
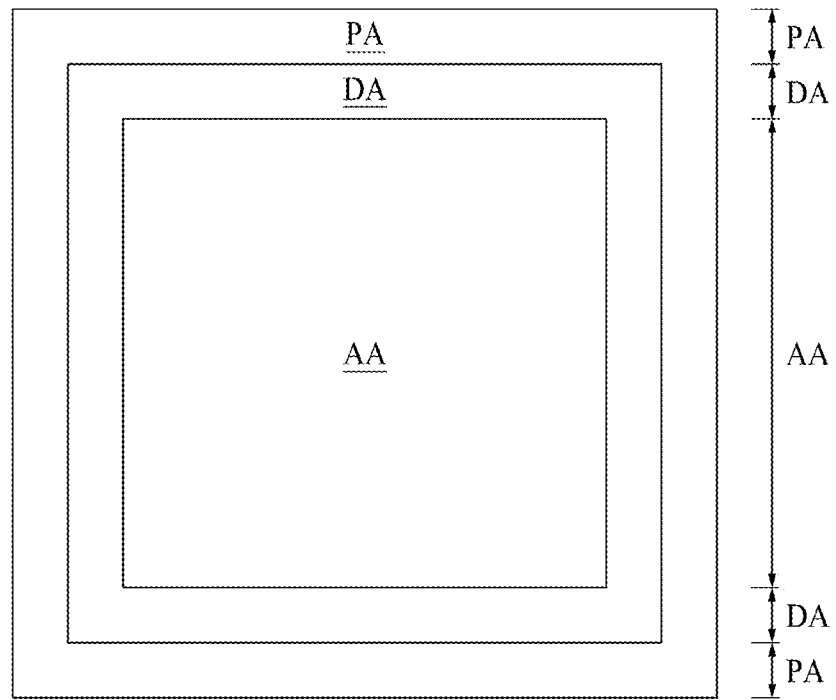
FIG. 2 is a plane view illustrating an electroluminescent display device according to one example embodiment of the present disclosure.

FIG. 2 is a plane view illustrating an electroluminescent display device according to one example embodiment of the present disclosure.

As shown in FIG. 2, the electroluminescent display device according to one example embodiment of the present disclosure may include an active area AA, a dummy area DA, and a pad area PA. The active area AA may serve as a display area for displaying an image. A plurality of pixels may be provided in the active area AA.

For example, signal lines, such as a gate line, a data line, a power line, and a reference line, may be provided in the active area AA. Also, a plurality of thin film transistors for switching a transmission of a signal applied through the signal line may be provided in the pixel of the active area AA, and an emission device that may be driven by the plurality of thin film transistors to emit light may be provided in the pixel of the active area AA.

The dummy area DA may surround the active area AA. For example, the dummy area DA may be provided at left, right, lower, and upper peripheral sides of the active area AA. A plurality of dummy pixels may be provided in the dummy area DA. However, the dummy area DA is not an area for displaying an image. As such, a structure of the dummy pixel provided in the dummy area DA may be different from a structure of the pixel provided in the active area AA. For example, at least any one among the signal line, the thin film transistor, and the emission device may be not provided or may be incompletely provided for the dummy pixel of the dummy area DA. Therefore, light may be not emitted from the dummy pixel provided in the dummy area DA. When a light emission is generated in the dummy area DA, a picture quality of the electroluminescent display device may be deteriorated due to a leaking light generated in the dummy area DA.

The dummy area DA prevents a manufacturing error between a middle portion of the active area AA and a peripheral portion of the active area AA. This will be described for example as follows.

A plurality of deposition processes and mask processes may be carried out to form the plurality of pixels in the active area AA. The deposition process may be carried out to form a particular insulating layer, a metal layer, or an organic layer through the use of a physical deposition process, a chemical deposition process, a coating process, or an inkjet process. The mask process may be carried out using the photolithography process to form a particular pattern having a particular shape in the insulating layer, the metal layer, or the organic layer formed by the deposition process.

If the plurality of deposition processes and mask processes are carried out in the active area AA, there may be a possibility of a manufacturing error occurring between the middle portion of the active area AA and the peripheral portion of the active area AA. Accordingly, as the dummy area DA may be provided in the periphery of the active area AA, the manufacturing error may be generated in the dummy area DA instead of the inside of the active area AA.

For example, if the emission layer is formed for the emission device by the use of inkjet process, the dryness of the emission layer in the middle portion of the substrate may be different from the dryness of the emission layer in the peripheral portion of the substrate. Thus, as the dummy area DA may be provided in the periphery of the active area AA, when forming the emission layer of the emission device by the inkjet process, the dryness may be not uniform in the emission layer between the active area AA and the dummy area DA. However, the dryness of the emission layer may be relatively uniform within the active area AA.

The pad area PA may be provided in the periphery of the dummy area DA. A circuit driver, such as a gate driver or a data driver, may be prepared in the pad area PA. The circuit driver may be provided in the periphery of at least one among left, right, lower, and upper sides of the dummy area DA. The circuit driver prepared in the pad area PA may be connected to the circuit device disposed within the active area AA after passing the dummy area DA.

Figure 3:
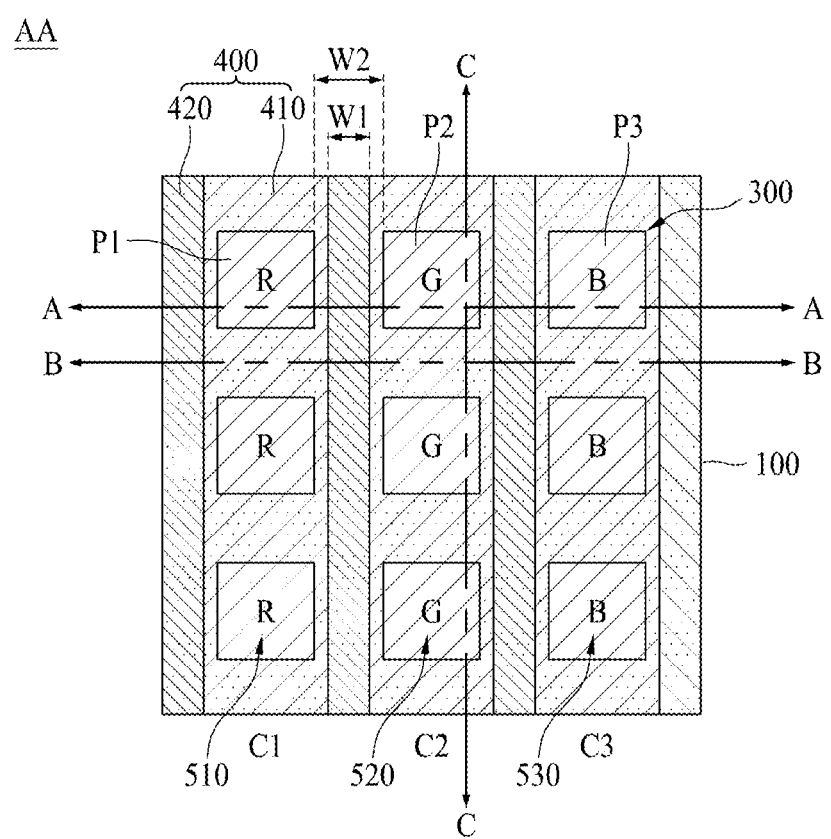
FIG. 3 is an enlarged plane view illustrating an electroluminescent display device according to one example embodiment of the present disclosure.
Figure 4A:
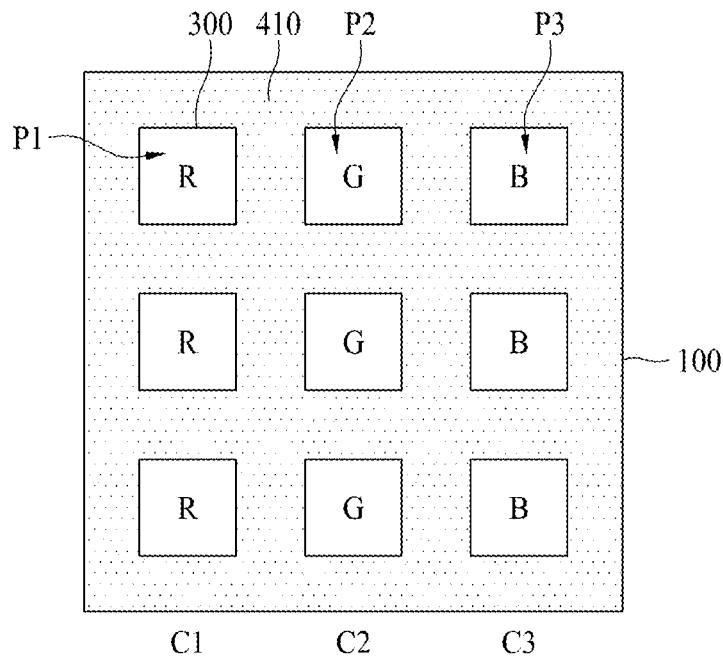
FIGS. 4A to 4C are enlarged plane views illustrating individual elements of the electroluminescent display device as shown in FIG. 3.
Figure 4B:
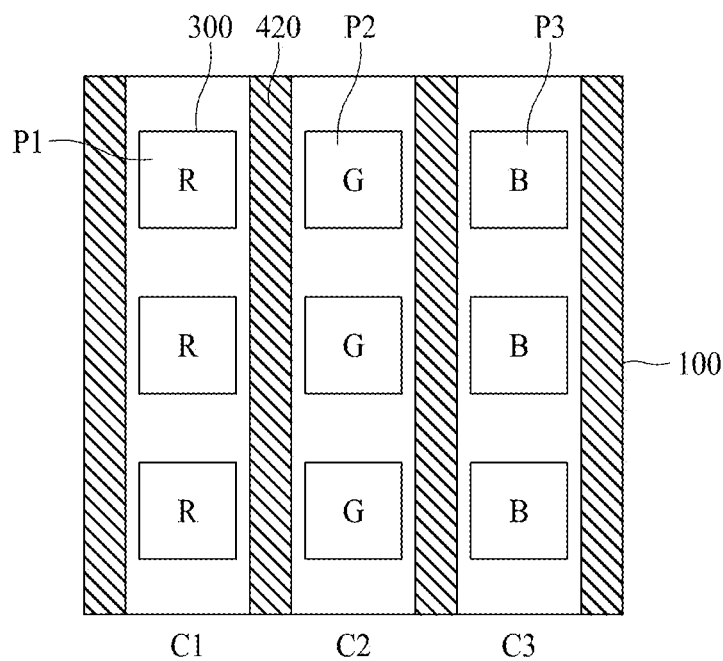
Figure 4C:
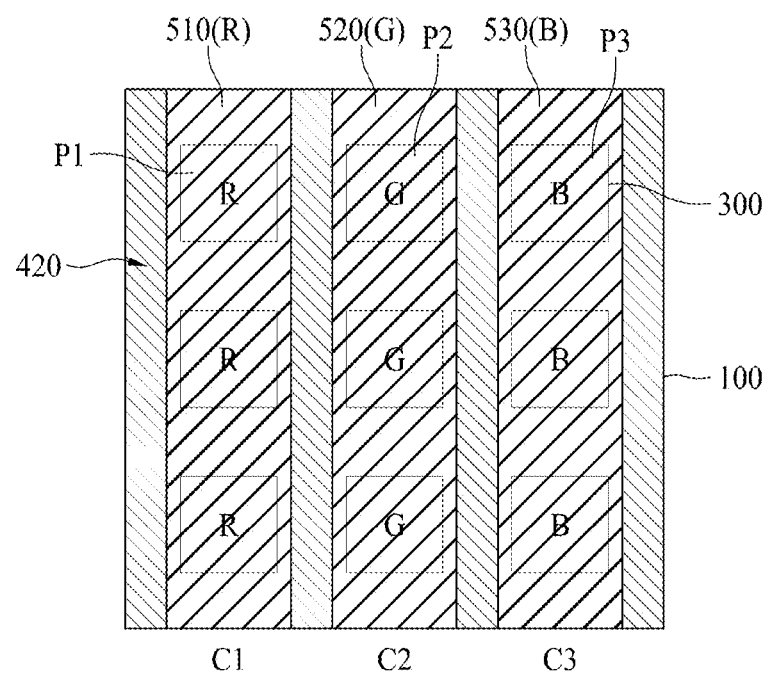

FIG. 3 is an enlarged plane view illustrating an electroluminescent display device according to one example embodiment of the present disclosure. FIGS. 4A to 4C are enlarged plane views illustrating individual elements of the electroluminescent display device as shown in FIG. 3.

FIG. 4A is an enlarged plane view illustrating a first bank of the electroluminescent display device according to one example embodiment of the present disclosure. FIG. 4B is an enlarged plane view illustrating a second bank of the electroluminescent display device according to one example embodiment of the present disclosure. FIG. 4C is an enlarged plane view illustrating an emission layer of the electroluminescent display device according to one example embodiment of the present disclosure. As shown in FIG. 3 and FIGS. 4A to 4C, the electroluminescent display device according to one example embodiment of the present disclosure may include a substrate 100, a first electrode 300, a bank 400, and an emission layer 510, 520, and 530.

A plurality of pixels may be provided on the active area AA of the substrate 100. The plurality of pixels may include a first pixel P1, a second pixel P2, and a third pixel P3. The first pixel P1 may emit first-colored light, for example, red R light; the second pixel P2 may emit second-colored light, for example, green G light; and the third pixel P3 may emit third-colored light, for example, blue B light.

The first pixel P1, the second pixel P2, and the third pixel P3 may be aligned in columns. For example, the plurality of first pixels P1 may be aligned in the first column C1, the plurality of second pixels P2 may be aligned in the second column C2, and the plurality of third pixels P3 may be aligned in the third column C3.

According to one example embodiment of the present disclosure, the plurality of pixels may be arranged in a plurality of rows and columns, while being provided at the particular intervals. For example, the pixels that emit the same-colored light may be disposed in the same pixel column, while being provided at the particular intervals; and the pixels that emit the different-colored light may be disposed in the different pixel columns, while being provided at the particular intervals. The first electrode 300 may be provided in each of the plurality of pixels. Thus, in a similar manner as the plurality of pixels, the plurality of first electrodes 300 may be arranged in a plurality of rows and columns, while being provided at the particular intervals.

The bank 400 may be provided in a matrix configuration along the boundary area among the plurality of pixels. For example, the bank 400 may be provided between the first pixel column C1 including the plurality of first pixels P1 and the second pixel column C2 including the plurality of second pixels P2, and may also be provided between the second pixel column C2 including the plurality of second pixels P2 and the third pixel column C3 including the plurality of third pixels P3. Also, the bank 400 may be provided among each of the plurality of first pixels P1 in the first pixel column C1, among each of the plurality of second pixels P2 in the second pixel column C2, and among each of the plurality of third pixels P3 in the third pixel column C3.

The bank 400 may include a first bank 410 and a second bank 420. These first and second banks 410 and 420 will be described later in the following cross-sectional views. The second bank 420 may be formed on an upper surface of the first bank 410.

The first bank 410 may make the emission layer 510, 520, and 530 easily spreadable in the individual pixel, e.g., pixel P1, P2, or P3. The second bank 420 may prevent the emission layer 510, 520, and 530 from intruding into the neighboring pixel column.

According to one example embodiment of the present disclosure, a pattern of the first bank 410 may be different from a pattern of the second bank 420, whereby it may be possible to make the emission layer 510, 520, and 530 spread easily in the individual pixel, e.g., pixel P1, P2, or P3, and to prevent the emission layer 510, 520, and 530 from intruding into the neighboring pixel column. Also, it may be possible to decrease the difference between a drying speed of the emission layer 510, 520, and 530 provided in the pixels of the middle portion of the active area AA and a drying speed of the emission layer 510, 520, and 530 provided in the pixels of the peripheral portion of the active area AA. Accordingly, it may be possible to realize the uniformity of light emission between the pixel of the middle portion of the active area AA and the pixel of the peripheral portion of the active area AA.

Hereinafter, the pattern in each of the first bank 410 and the second bank 420 for realizing the above effects will be described for example. The first bank 410 may be formed in the matrix configuration on the entire boundary area between each of the plurality of pixels. For example, the first bank 410 may be provided between each of the plurality of pixel columns C1, C2, and C3, and may also be provided between each of the plurality of first pixels P1 in the same pixel column, between each of the plurality of second pixels P2 in the same pixel column and between each of the plurality of third pixels P3 in the same pixel column.

The first bank 410 may cover sides of the first electrode 300, whereby the remaining portions, other than the sides of the first electrode 300, may be exposed without being covered by the first bank 410. For example, the first electrode 300 shown in FIG. 3 and FIGS. 4A to 4C corresponds to the remaining portions of the first electrode 300 that may be exposed without being covered by the first bank 410. This will be readily understood with reference to the following cross-sectional views.

The second bank 420 may be provided between each of the plurality of pixel columns C1, C2, and C3. However, the second bank 420 may be not provided between each of the plurality of first pixels P1 included in the same pixel column, between each of the plurality of second pixels P2 included in the same pixel column, and between each of the plurality of third pixels P3 included in the same pixel column. Thus, the second bank 420 may be formed in a stripe structure by repeatedly providing the above continuous straight-line structure between each of the plurality of pixel columns.

Accordingly, the first bank 410 and the second bank 420 may be provided between each of the plurality of pixel columns C1, C2, and C3, e.g., between the first pixel column C1 and the second pixel column C2, and between the second pixel column C2 and the third pixel column C3. As such, it may be possible to prepare the relatively-high bank 400.

Because the bank 400 may have a relatively high height, the first emission layer 510 in the first pixel column C1 may be not mixed with the second emission layer 520 in the second pixel column C2, and the second emission layer 520 in the second pixel column C2 may be not mixed with the third emission layer 530 in the third pixel column C3. For example, when each of the first emission layer 510, the second emission layer 520, and the third emission layer 530 spreads to the left and right sides, the bank 400 having the relatively high height serves as a barrier wall so that it may be possible to prevent the emission layer 510, 520, and 530 in each pixel column, e.g., column C1, C2, or C3, from being mixed with another emission layer, e.g., layer 510, 520, or 530 in the neighboring pixel column.

The first bank 410 may be provided between each of the plurality of first pixels P1 included in the first pixel column C1, between each of the plurality of second pixels P2 included in the second pixel column C2, and between each of the plurality of third pixels P3 included in the third pixel column C3. Meanwhile, the second bank 420 may be not provided between the first, second, and third pixel columns C1, C2, and C3. Therefore the bank between pixels within the same column has only the first bank 410 to have the relatively low height.

Owing to the relatively low height of the first bank 410, the first emission layer 510 formed in the first pixel column C1 may smoothly spread to the area between each of the plurality of first pixels P1, the second emission layer 520 formed in the second pixel column C2 may smoothly spread to the area between each of the plurality of second pixels P2, and the third emission layer 530 formed in the third pixel column C3 may smoothly spread to the area between each of the plurality of third pixels P3. For example, when each of the first emission layer 510, the second emission layer 520, and the third emission layer 530 spreads to the lower and upper sides, the first bank 410 having the relatively low height may not serve as a barrier wall so that each emission layer 510, 520, and 530 may smoothly spread to the lower and upper sides of each column, e.g., column C1, C2, or C3.

Accordingly, as the first emission layer 510 may smoothly spread to the area between each of the plurality of first pixels P1, it may be possible to decrease the difference of drying speed between the first emission layer 510 in the middle portion of the active area AA and the first emission layer 510 in the peripheral portion of the active area AA. As a result, it may be possible to realize uniformity of light emission between the first pixel P1 prepared in the middle portion of the active area AA and the first pixel P1 prepared in the peripheral portion of the active area AA.

In a similar manner, the second emission layer 520 may smoothly spread to the area between each of the plurality of second pixels P2, whereby it may be possible to decrease the difference of drying speed between the second emission layer 520 in the middle portion of the active area AA and the second emission layer 520 in the peripheral portion of the active area AA. Therefore, it may be possible to realize uniformity of light emission between the second pixel P2 prepared in the middle portion of the active area AA and the second pixel P2 prepared in the peripheral portion of the active area AA. Also, as the third emission layer 530 may smoothly spread to the area between each of the plurality of third pixels P3, it may be possible to decrease the difference of drying speed between the third emission layer 530 formed in the middle portion of the active area AA and the third emission layer 530 formed in the peripheral portion of the active area AA. Therefore, it may be possible to realize uniformity of light emission between the third pixel P3 prepared in the middle portion of the active area AA and the third pixel P3 prepared in the peripheral portion of the active area AA.

The second bank 420 may not overlap with the remaining portions of the first electrode 300 that may be exposed without being covered by the first bank 410. For example, in the case of the area between each of the plurality of pixel columns, a width W1 of the second bank 420 may be smaller than a width W2 of the first bank 410. In other words, in the area between the first pixel P1 and the second pixel P2 and in the area between the second pixel P2 and the third pixel P3, the width W1 of the second bank 420 may be smaller than the width W2 of the first bank 410. Therefore, some portions of the first bank 410 may be exposed. Accordingly, each of the first emission layer 510, the second emission layer 520, and the third emission layer 530 may easily spread from the left side to the right side within the individual pixel, e.g., pixel P1, P2, or P3.

The emission layers may include the first emission layer 510, the second emission layer 520, and the third emission layer 530. The first emission layer 510, the second emission layer 520, and the third emission layer 530 may be configured to emit the different-colored light. For example, the first emission layer 510 may emit red-colored light R, the second emission layer 520 may emit green-colored light G, and the third emission layer 530 may emit blue-colored light B, but embodiments are not limited to these colors. For example, the first emission layer 510, the second emission layer 520, and the third emission layer 530 may emit the same-colored light, such as white light. In this case, a color filter may be additionally provided in an advancing path of light emitted from the emission layer by each of the plurality of pixels P1, P2, and P3.

The first emission layer 510 may be provided inside each of the plurality of first pixels P1, and may also be provided between each of the plurality of first pixels P1. For example, the first emission layer 510 may be provided in a continuous structure along an extending direction of the first pixel column C1, for example, a continuous straight-line structure.

The second emission layer 520 may be provided inside each of the plurality of second pixels P2, and may also be provided between each of the plurality of second pixels P2. For example, the second emission layer 520 may be provided in a continuous structure along an extending direction of the second pixel column C2, for example, a continuous straight-line structure.

The third emission layer 530 may be provided inside each of the plurality of third pixels P3, and may also be provided between each of the plurality of third pixels P3. For example, the third emission layer 530 may be provided in a continuous structure along an extending direction of the third pixel column C3, for example, a continuous straight-line structure. Accordingly, the emission layers may be formed in a stripe structure by repeatedly providing the first emission layer 510, the second emission layer 520, and the third emission layer 530 of the continuous structure.

As described above, the bank 400 having the relatively high height, which may be obtained by combining the first bank 410 and the second bank 420, may be prepared between the first pixel column C1 and the second pixel column C2, and between the second pixel column C2 and the third pixel column C3. As such, it may be possible to prevent the first emission layer 510, the second emission layer 520, and the third emission layer 530 from being mixed together.

Also, the bank having relatively low height, which may be obtained only by the first bank 410, may be between each of the plurality of first pixels P1 in the first pixel column C1, between each of the plurality of second pixels P2 in the second pixel column C2, and between each of the plurality of third pixels P3 in the third pixel column C3. Therefore, each of the first emission layer 510, the second emission layer 520, and the third emission layer 530 may be formed in the continuous structure within each pixel column, e.g., column C1, C2, or C3.

Figure 5:
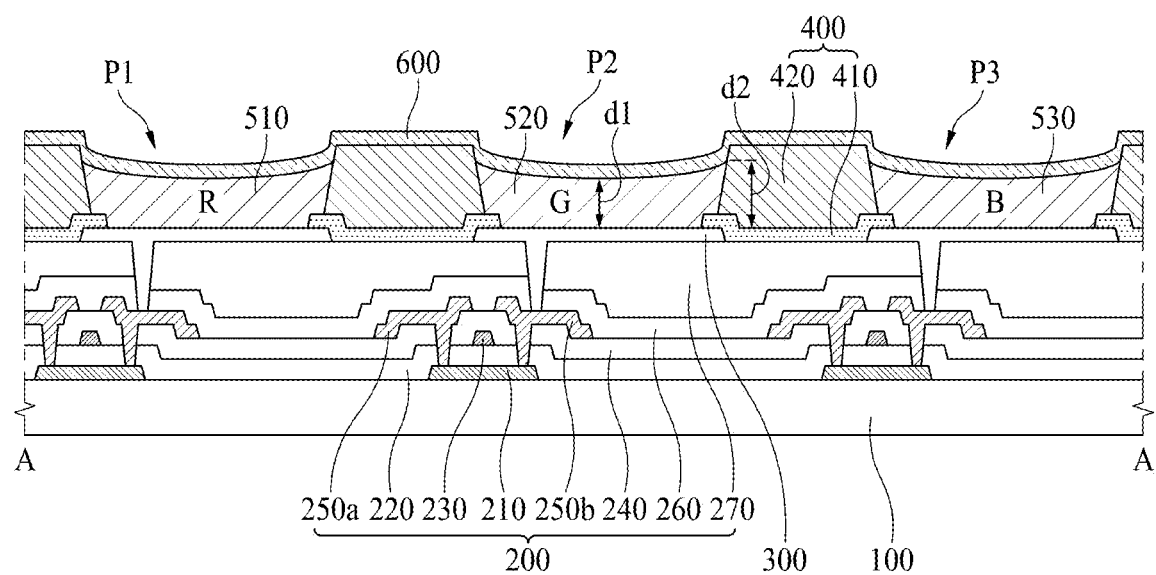
FIG. 5 is a cross-sectional view illustrating a structure of the electroluminescent display device according to one example embodiment of the present disclosure, taken along line A-A of FIG. 3 and FIGS. 4A to 4C.

FIG. 5 is a cross-sectional view illustrating a structure of the electroluminescent display device according to one example embodiment of the present disclosure, taken along line A-A of FIG. 3 and FIGS. 4A to 4C.

FIG. 5 corresponds to the cross-section along the cutting line that may pass the different pixels P1, P2, and P3 in the lateral direction. As shown in FIG. 5, a circuit device layer 200, a first electrode 300, a bank 400, an emission layer 510, 520, and 530, and a second electrode 600 may be formed on a substrate 100.

The substrate 100 may be formed of a glass or plastic material, but embodiments are not limited to this material. The substrate 100 may be formed of a transparent material or an opaque material.

When the electroluminescent display device according to one example embodiment of the present disclosure is a top-emission type, in which the emitted light may be radiated toward an upper direction, the substrate 100 may be formed of the opaque material, as well as the transparent material. When the electroluminescent display device according to one example embodiment of the present disclosure is a bottom-emission type, in which the emitted light may be radiated toward a lower direction, the substrate 100 may be formed of the transparent material.

The circuit device layer 200 may be formed on the substrate 100. The circuit device layer 200 may include an active layer 210, a gate insulating film 220, a gate electrode 230, an insulating interlayer 240, a source electrode 250a, a drain electrode 250b, a passivation layer 260, and a planarization layer 270.

The active layer 210 may be formed on the substrate 110. The active layer 210 may be formed of a silicon-based semiconductor material or an oxide-based semiconductor material, but embodiments are not limited to these materials. Although not shown, a light-shielding layer may be additionally provided between the substrate 100 and the active layer 210 so that it may be possible to prevent light from being advanced to the active layer 210, to thereby reduce or prevent a deterioration of the active layer 210.

The gate insulating film 220 may be formed on the active layer 210, to thereby insulate the active layer 210 and the gate electrode 230 from each other. The gate electrode 230 may be formed on the gate insulating film 220. The insulating interlayer 240 may be formed on the gate electrode 230, and the insulating interlayer 240 may insulate the gate electrode 230 from the source and drain electrodes 250a and 250b.

The source electrode 250a may be provided at a particular interval from the drain electrode 250b, and the source electrode 250a and the drain electrode 250b confronting each other may be provided on the insulating interlayer 240. The source electrode 250a and the drain electrode 250b may be respectively connected with one end and the other end of the active layer 210 via contact holes in the insulating interlayer 240 and the gate insulating film 220.

The passivation layer 260 may be on the source electrode 250a and the drain electrode 250b, to thereby protect a thin film transistor. The planarization layer 270 may be formed on the passivation layer 260, to thereby planarize a surface of the substrate 100.

Accordingly, the circuit device layer 200 may include the thin film transistor having the gate electrode 230, the active layer 210, the source electrode 250a, and the drain electrode 250b. FIG. 5 shows the thin film transistor having a top-gate structure in which the gate electrode 230 is provided above the active layer 210, but embodiments are not limited to this type. For example, the thin film transistor having a bottom-gate structure, in which the gate electrode 230 may be provided below the active layer 210, may be provided in the circuit device layer 200.

In the circuit device layer 200, a circuit device including various signal lines, a thin film transistor, and a capacitor may be provided for each pixel. The signal lines may include a gate line, a data line, a power line, and a reference line. The thin film transistor may include a switching thin film transistor, a driving thin film transistor, and a sensing thin film transistor. The thin film transistor shown in FIG. 5 corresponds to the driving thin film transistor.

Accordingly, as the switching thin film transistor may be switched in accordance with a gate signal supplied to the gate line, a data voltage provided from the data line may be supplied to the driving thin film transistor by the use of switching thin film transistor. Furthermore, as the driving thin film transistor may be switched in accordance with the data voltage supplied from the switching thin film transistor, the driving thin film transistor may generate a data current by power supplied from the power line, and may supply the generated data current to the first electrode 300.

The sensing thin film transistor may sense a threshold voltage deviation of the driving thin film transistor, which may cause a deterioration of video quality. The sensing thin film transistor may supply a current of the driving thin film transistor to the reference line in response to a sensing control signal supplied from the gate line or an additional sensing line.

The capacitor may maintain the data voltage supplied to the driving thin film transistor for one frame period. The capacitor may be connected with each of gate and source terminals of the driving thin film transistor.

The electroluminescent display device according to one example embodiment of the present disclosure corresponds to a top-emission type. For example, even though the thin film transistor may be below the emission layer 500, the light emission may be not influenced by the thin film transistor. Thus, the thin film transistor may be below the emission layer 500.

The first electrode 300 may be formed on the circuit device layer 200. The first electrode 300 may be patterned per each of the plurality of pixels P1, P2, and P3. The first electrode 300 may function as an anode of the electroluminescent display device.

When the electroluminescent display device according to one example embodiment of the present disclosure is applied to a top-emission type, the first electrode 300 may include a reflective material for upwardly reflecting the light emitted from the emission layer 500. In this case, the first electrode 300 may be formed in a stacked structure, including the reflective material and transparent conductive material. When a bottom-emission type is applied to the electroluminescent display device according to one example embodiment of the present disclosure, the first electrode 300 may be formed of the transparent conductive material.

The first electrode 300 may be connected with the drain electrode 250b of the thin film transistor via the contact hole provided in the planarization layer 270 and the passivation layer 260. In some cases, the first electrode 300 may be connected with the source electrode 250a of the thin film transistor via the contact hole in the planarization layer 270 and the passivation layer 260.

The bank 400 may be formed in the boundary line between each of the plurality of pixels P1, P2, and P3. For example, the bank 400 may be formed in the boundary line between the first pixel P1 and the second pixel P2, between the second pixel P2 and the third pixel P3, and between the third pixel P3 and the first pixel P1.

The bank 400 may cover four side edges of the first electrode 300, and may be provided on the planarization layer 270. Thus, the plurality of first electrodes 300, which may be patterned per each of the plurality of pixels P1, P2, and P3, may be insulated from each other by the bank 400.

The bank 400 may include the first bank 410 and the second bank 420. The first bank 410 may cover four side edges of the first electrode 300. The first bank 410 may be formed on the circuit device layer 200. Thus, the remaining portions of the first bank 410 that are not covered by the first bank 410 may be exposed externally.

A thickness of the first bank 410 may be relatively thinner than a thickness of the second bank 420, and a width of the first bank 410 may be relatively larger than a width of the second bank 420. In a similar manner as the emission layer, the first bank 410 having the above structure may have a hydrophilic property. The first bank 410 having the hydrophilic property may be formed of an inorganic insulating material, such as silicon oxide. Thus, when the emission layers 510, 520, and 530 are formed by an inkjet process, a solution for forming the emission layers 510, 520, and 530 may spread easily on the first bank 410.

The second bank 420 may be formed on the first bank 410. The width of the second bank 420 may be smaller than the width of the first bank 410, whereby some portions of the first bank 410 may be exposed. For example, the second bank 420 may not overlap the remaining portions of the first electrode 300 that may be exposed without being covered by the first bank 410. Thus, the entire area of the remaining portions of the first electrode 300, which may be exposed without being covered by the first bank 410, may be in contact with the lower surface of the emission layer, e.g., layer 510, 520, or 530.

The second bank 420 may be obtained by coating a mixture solution of an organic insulating material having the hydrophilic property and a hydrophobic material, such as fluorine, and patterning the coated mixture solution, e.g., by a photolithography process. By the light irradiated for the photolithography process, the hydrophobic material, such as fluorine, may move to an upper portion of the second bank 420. As a result, the upper portion of the second bank 420 may have the hydrophobic property, and the remaining portions of the second bank 420 may have the hydrophilic property. For example, the lower portion of the second bank 420 that contacts the first bank 410 may have the hydrophilic property, and the upper portion of the second bank 420 may have the hydrophobic property, but embodiments are not limited to this structure. For example, the entirety of the second bank 420 may have the hydrophobic property.

Herein, spreadability of the solution for forming the emission layers 510, 520, and 530 may be improved due to the first bank 410 having the hydrophilic property and the lower portion of the second bank 420 having the hydrophilic property. For example, as the first bank 410 may have the relatively thinner thickness and the relatively larger width in comparison to the second bank 420, it may be possible to prepare a two-step structure of the hydrophilic property by the combination of the first bank 410 and second bank 420. As such, the solution for forming the emission layer, e.g., layer 510, 520, or 530 may easily spread from the left side to the right side of the individual pixel, e.g., pixel P1, P2, or P3.

Also, the upper portion of the second bank 420 having the hydrophobic property may prevent the solution for forming the emission layers 510, 520, and 530 from spreading to another neighboring pixel area. As such, it may be possible to prevent the emission layer, e.g., layer 510, 520, or 530 of one pixel area from being mixed with the emission layer, e.g., layer 510, 520, or 530 of another neighboring pixel area.

The emission layer may be formed on the first electrode 300. The emission layer may include the first emission layer 510 in the first pixel P1, the second emission layer 520 in the second pixel P2, and the third emission layer 530 in the third pixel P3.

The emission layers 510, 520, and 530 may be formed by the solution process, e.g., using the inkjet apparatus. When the emission layers 510, 520, and 530 are formed by the inkjet process, a height d1 of an upper end of the emission layer, e.g., layer 510, 520, or 530 at the center of the individual pixel area, e.g., pixel P1, P2, or P3, after a drying process of the solution for forming the emission layer, e.g., layer 510, 520, or 530 may be lower than a height d2 of an upper end of the emission layer, e.g., layer 510, 520, or 530, at the lateral ends of the individual pixel area, e.g., pixel P1, P2, or P3, for example, at the lateral ends being in contact with the second bank 420. For example, as shown in the drawings, according as the height of the emission layer, e.g., layer 510, 520, or 530, may be gradually lowered from the lateral end of the individual pixel area, e.g., pixel P1, P2, or P3, in contact with the second bank 420 to the center of the individual pixel area, e.g., pixel P1, P2, or P3, a concave profile may be acquired in which the height may be gradually lowered from the edges to the center. Accordingly, a particular portion of a second electrode 600 formed on the emission layers 510, 520, and 530 may have a profile corresponding to the profile of the emission layers 510, 520, and 530. The emission layers 510, 520, and 530 may include at least one organic layer among a hole injecting layer, a hole transporting layer, an organic emitting layer, an electron transporting layer, and an electron injecting layer.

The second electrode 600 may be formed on the emission layers 510, 520, and 530. The second electrode 600 may function as a cathode of the electroluminescent display device. The second electrode 600 may be formed on the bank 400, as well as the emission layers 510, 520, and 530. The second electrode 600 may also be formed in the plurality of pixel areas P1, P2, and P3, as well as in the boundary area between each of the plurality of pixel areas P1, P2, and P3. For example, the second electrode 600 may be formed on the entire active area of the substrate 100. Accordingly, the second electrode 600 may function as a common electrode for applying a common voltage to the plurality of pixels P1, P2, and P3.

Figure 6:
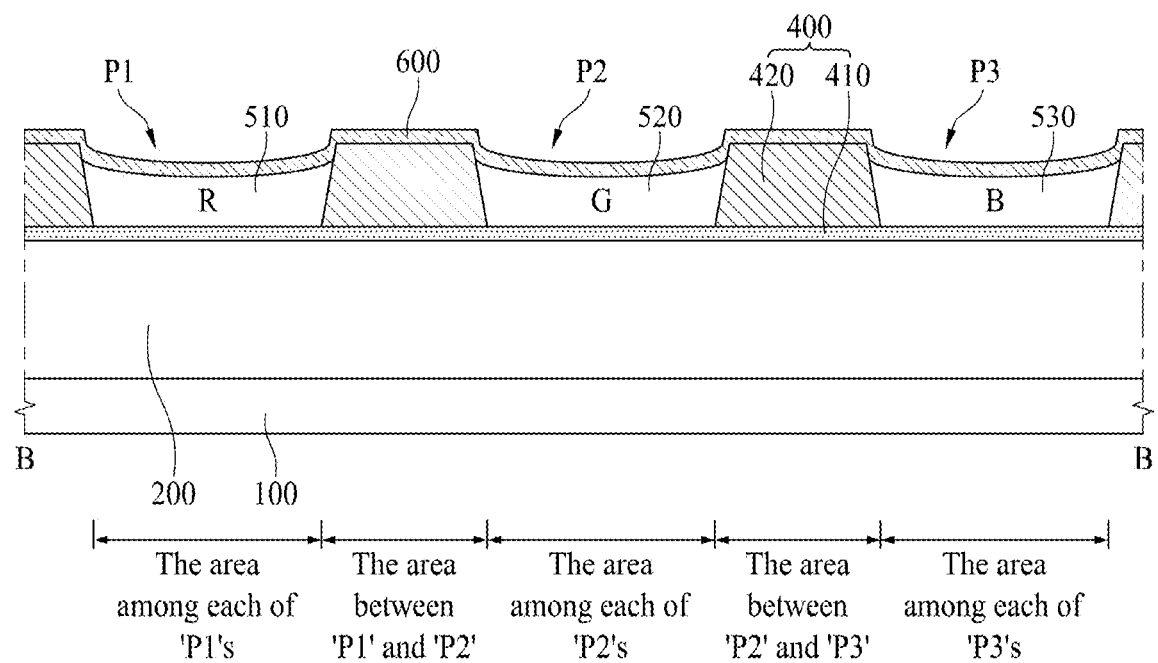
FIG. 6 is a cross-sectional view illustrating a structure of the electroluminescent display device according to one example embodiment of the present disclosure, taken along line B-B of FIG. 3.

FIG. 6 is a cross-sectional view illustrating a structure of the electroluminescent display device according to one example embodiment of the present disclosure, taken along line B-B of FIG. 3.

FIG. 6 corresponds to the cross-section that shows the line passing the pixel columns C1, C2, and C3 for emitting the different-colored light and the area between each of the pixels P1, P2, and P3 for emitting the same-colored light. As shown in FIG. 6, a circuit device layer 200, a bank 400 including a first bank 410 and a second bank 420, an emission layer including a first emission layer 510, a second emission layer 520 and a third emission layer 530, and a second electrode 600 may be formed on a substrate 100. Hereinafter, only the structures that are different from those of FIG. 5 will be described in detail.

FIG. 6 shows the area between the neighboring first pixels P1, the area between the neighboring second pixels P2, and the area between the neighboring third pixels P3, and a first electrode 300 may be not provided between the circuit device layer 200 and the bank 400. The first electrode 300 may be provided per each individual pixels P1, P2, and P3. However, the first electrode 300 may extend to the area between the neighboring pixels to be connected with a driving thin film transistor provided inside the circuit device layer 200.

The first bank 410 may be in contact with an upper surface of the circuit device layer 200. The first bank 410 may be formed in the area between the neighboring first pixels P1, the area between the neighboring second pixels P2, the area between the neighboring third pixels P3, the area between the neighboring first and second pixels P1 and P2, and the area between the neighboring second and third pixels P2 and P3.

The second bank 420 may be in contact with an upper surface of the first bank 410. The second bank 420 may be not formed in the area between the neighboring first pixels P1, the area between the neighboring second pixels P2, and the area between the neighboring third pixels P3, but may be formed in the area between the neighboring first and second pixels P1 and P2, and the area between the neighboring second and third pixels P2 and P3.

Accordingly, the first emission layer 510 may be formed in the area between the neighboring first pixels P1 on the first bank 410. However, the second bank 420 may function as a barrier wall. Therefore, it may be possible to prevent the first emission layer 510 from intruding into the second pixel P2. Similarly, the second emission layer 520 may be formed in the area between the neighboring second pixels P2 on the first bank 410. However, the second bank 420 may function as a barrier wall. Therefore, it may be possible to prevent the second emission layer 520 from intruding into the first pixel P1 and the third pixel P3. Also, the third emission layer 530 may be formed in the area between the neighboring third pixels P3 on the first bank 410. However, the second bank 420 may function as a barrier wall. Therefore, it may be possible to prevent the third emission layer 530 from intruding into the second pixel P2 and the first pixel P1.

Figure 7:
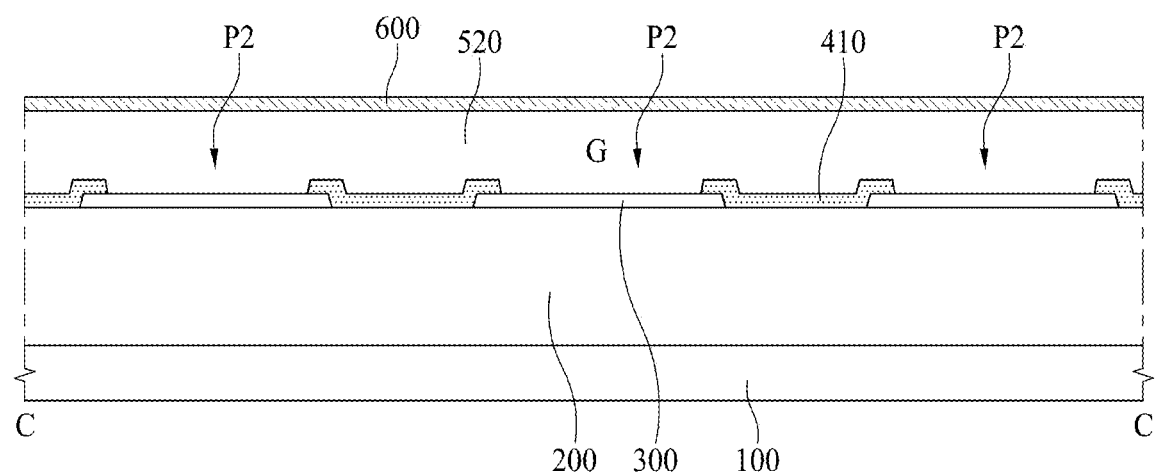
FIG. 7 is a cross-sectional view illustrating a structure of the electroluminescent display device according to one example embodiment of the present disclosure, taken along line C-C of FIG. 3.

FIG. 7 is a cross-sectional view illustrating a structure of the electroluminescent display device according to one example embodiment of the present disclosure, taken along line C-C of FIG. 3.

FIG. 7 corresponds to the cross-section of the line that may pass only the second pixels P2 for emitting the same-colored light. As shown in FIG. 7, a circuit device layer 200, a first electrode 300, a first bank 410, a second emission layer 520, and a second electrode 600 may be formed on a substrate 100. Hereinafter, only the structures that are different from those of FIGS. 5 and 6 will be described in detail.

The first electrode 300 may be formed in each of the plurality of second pixels P2 on the circuit device layer 200, and the first bank 410 may be formed between each of the plurality of second pixels P2 while covering side ends of the first electrode 300. A second bank 420 may be not provided in the area between each of the plurality of second pixels P2 for emitting the same-colored light. Thus, the second emission layer 520 may be continuously formed over the plurality of second pixels P2, and may also be formed over the area between each of the plurality of second pixels P2. Accordingly, an upper surface of the first bank 410, which may be exposed without being covered by the second bank 420, may be in contact with the bottom surface of the second emission layer 520.

Also, along the column direction, the second emission layer 520 may be not in contact with the second bank 420 so that the second emission layer 520 may have a uniform height. With reference to FIG. 5, when both side ends of the second emission layer 520 are in contact with the second bank 420, a height of the second emission layer 520 may be gradually lowered from the end of the second pixel P2 contacting the second bank 420 to the center of the second pixel P2. The surface of the second emission layer 520 may have a concave profile. Meanwhile, as shown in FIG. 7, when the second emission layer 520 is not in contact with the second bank 420 along the column direction, a height of the second emission layer 520 may be uniform on the whole. Also, the second bank 420 may be not provided so that the second electrode 600 may be formed on an upper surface of the second emission layer 520.

Meanwhile, although not shown in the drawings, except for the first emission layer 510 and the third emission layer 530 being formed instead of the second emission layer 520, the cross-section of the line that may longitudinally pass the first pixels P1 and the cross-section of the line that may longitudinally pass the third pixels P3 may be substantially similar in structure to those of FIG. 7.

Figure 8:
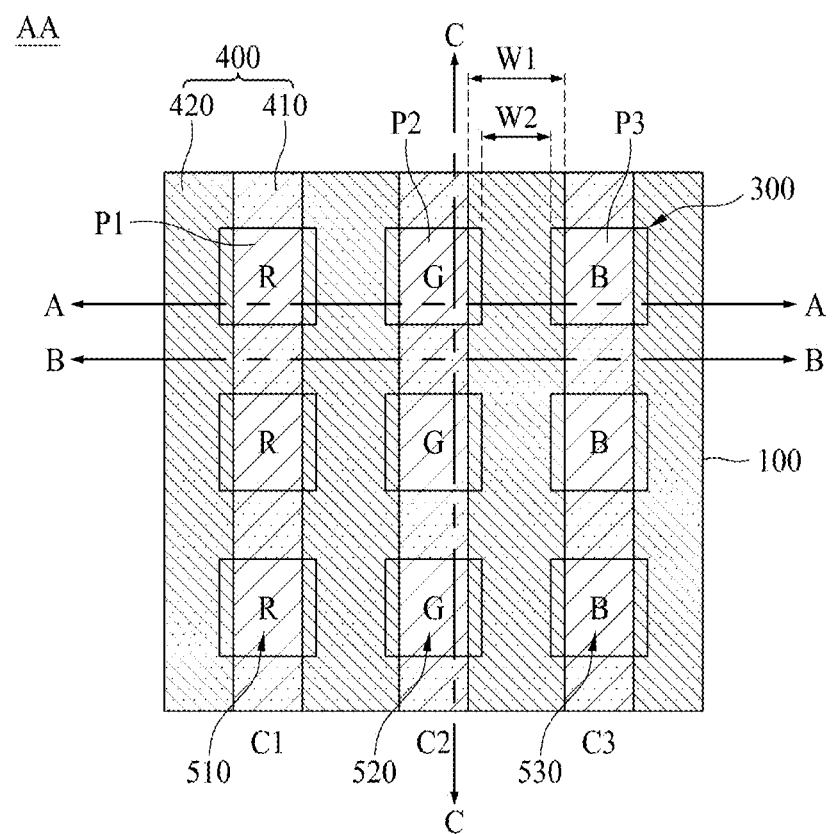
FIG. 8 is an enlarged plane view illustrating an electroluminescent display device according to another example embodiment of the present disclosure.
Figure 9A:
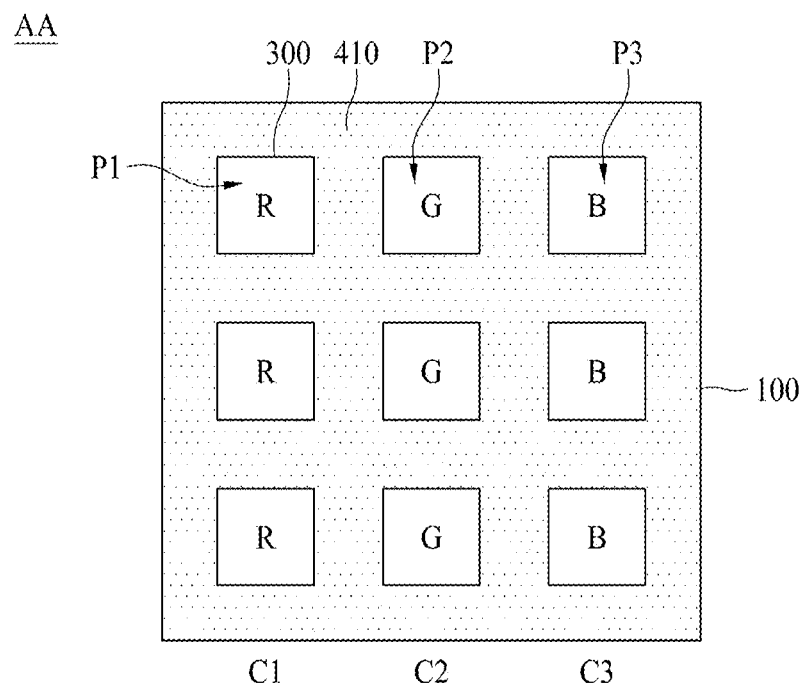
FIGS. 9A to 9C are enlarged plane views illustrating individual elements of the electroluminescent display device as shown in FIG. 8.
Figure 9B:
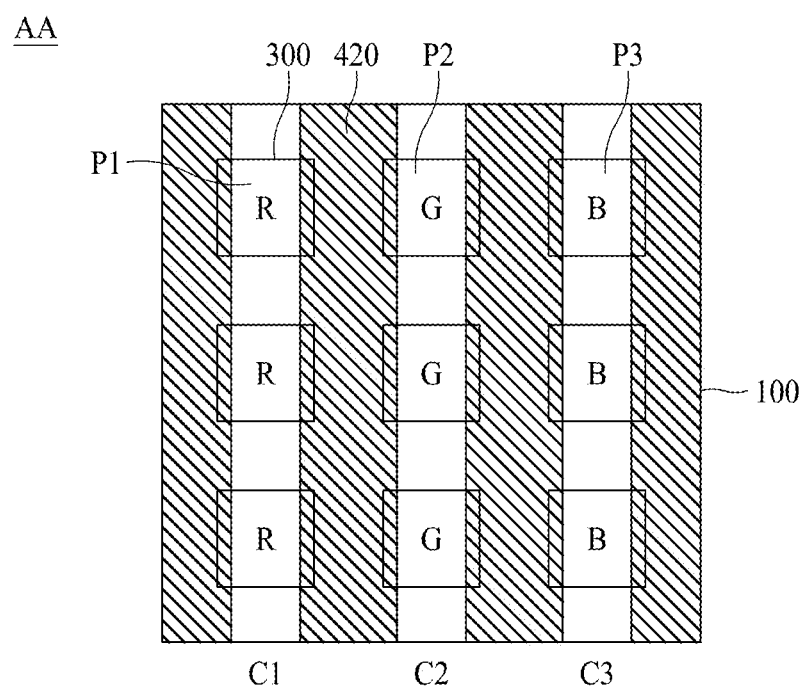
Figure 9C:
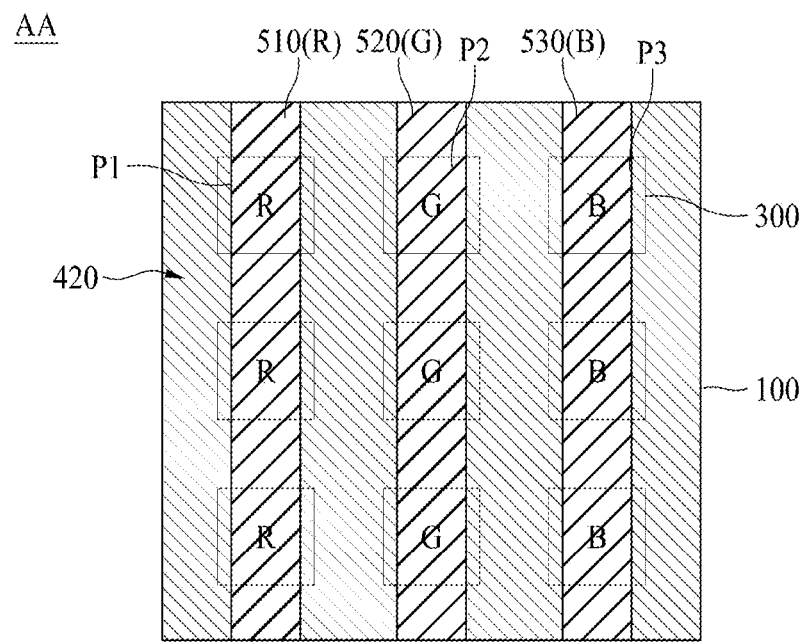

FIG. 8 is an enlarged plane view illustrating an electroluminescent display device according to another example embodiment of the present disclosure. FIGS. 9A to 9C are enlarged plane views illustrating individual elements of the electroluminescent display device as shown in FIG. 8.

FIG. 9A is an enlarged plane view illustrating a first bank of the electroluminescent display device according to the another example embodiment of the present disclosure. FIG. 9B is an enlarged plane view illustrating a second bank of the electroluminescent display device according to the another example embodiment of the present disclosure. FIG. 9C is an enlarged plane view illustrating an emission layer of the electroluminescent display device according to the another example embodiment of the present disclosure.

The electroluminescent display device as shown in FIG. 8 and FIGS. 9A to 9C may be obtained by changing a structure of a second bank 420 in the electroluminescent display device as shown in FIG. 3 and FIGS. 4A to 4C. Hereinafter, only the different structures will be described in detail.

In the aforementioned electroluminescent display device as shown in FIG. 3 and FIGS. 4A to 4C, the second bank 420 may not overlap the remaining portions of the first electrode 300 that are exposed without being covered by the first bank 410. Thus, in the area between each of the plurality of pixel columns C1, C2, and C3, the width W1 of the second bank 420 may be smaller than the width W2 of the first bank 410. For example, in the electroluminescent display device as shown in FIG. 3 and FIGS. 4A to 4C, the width W1 of the second bank 420 may be smaller than the width W2 of the first bank 410 in the area between the first pixel P1 and the second pixel P2 and the area between the second pixel P2 and the third pixel P3.

Meanwhile, in the electroluminescent display device as shown in FIG. 8 and FIGS. 9A to 9C, a second bank 420 may partially overlap the remaining portions of a first electrode 300 that are exposed without being covered by a first bank 410. As a result, a width W1 of the second bank 420 may be larger than a width W2 of the first bank 410 in the area between each of the plurality of pixel columns C1, C2, and C3. For example, in the examples of the electroluminescent display device as shown in FIG. 8 and FIGS. 9A to 9C, the width W1 of the second bank 420 may be larger than the width W2 of the first bank 410 in the area between the first pixel P1 and the second pixel P2, and in the area between the second pixel P2 and the third pixel P3.

As shown in FIG. 3 and FIGS. 4A to 4C, when the second bank 420 does not overlap the remaining portions of the first electrode 300 that are exposed without being covered by the first bank 410, each of the first emission layer 510, the second emission layer 520, and the third emission layer 530 may contact both ends of the first bank 410 within each individual pixel, e.g., pixel P1, P2, or P3, and may easily spread from the left side to the right side. However, when the pattern is not uniform at the both ends of the first bank 410 during the process of patterning the first bank 410, each of the first emission layer 510, the second emission layer 520, and the third emission layer 530 may not have the uniform profile within each individual pixel, e.g., pixel P1, P2, or P3.

In the another embodiment of the present disclosure shown in FIG. 8 and FIGS. 9A to 9C, the second bank 420 may partially overlap the remaining portions of the first electrode 300 that are exposed without being covered by the first bank 410. Thus, even is the pattern is not uniform in the both ends of the first bank 410, each of the first emission layer 510, the second emission layer 520, and the third emission layer 530 may have the uniform profile within each individual pixel, e.g., pixel P1, P2, or P3. This will be readily understood with reference to the following cross-sectional views.

Figure 10:
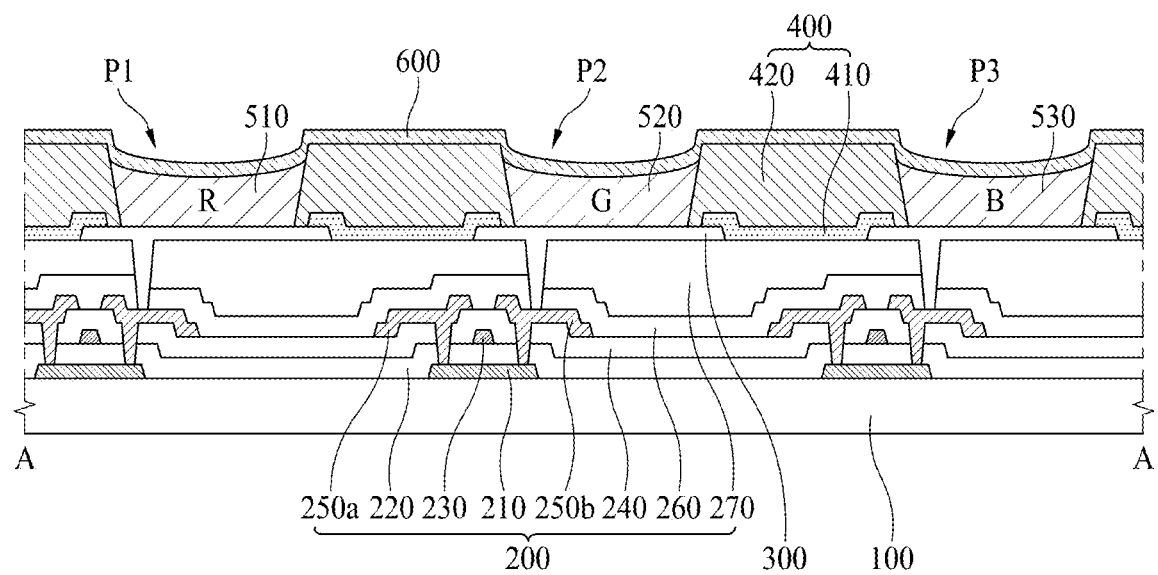
FIG. 10 is a cross-sectional view illustrating a structure of the electroluminescent display device according to another example embodiment of the present disclosure, taken along line A-A of FIG. 8.

FIG. 10 is a cross-sectional view illustrating a structure of the electroluminescent display device according to another example embodiment of the present disclosure, taken along line A-A of FIG. 8.

FIG. 10 corresponds to the cross-section of the line that may laterally pass the different pixels P1, P2, and P3. Except for a structure of the second bank 420 and the emission layers 510, 520, and 530, the structure shown in FIG. 10 is substantially similar to the structure shown in FIG. 5, whereby the same reference numbers will be used throughout the drawings to refer to the same parts, and only the different structure will be described in detail.

The second bank 420 may partially overlap the remaining portions of the first electrode 300 that are exposed without being covered by the first bank 410. Thus, both side ends of the first electrode 300 may be in contact with the bottom surface of the first bank 410 and the bottom surface of the second bank 420, while being covered by the first bank 410 and the second bank 420. Also, the remaining portions of the first electrode 300, which may be exposed without being covered by the first bank 410 and the second bank 420, may be in contact with the bottom surface of the emission layers 510, 520, and 530.

Accordingly, both side ends of the emission layers 510, 520, and 530, for example, both entire lateral surfaces of the emission layers 510, 520, and 530, may be in contact with the second bank 420, without being in contact with the first bank 410. Thus, even is the pattern is not uniform in both side ends of the first bank 410, each of the emission layers 510, 520, and 530 may have the uniform profile at inside of each individual pixel, e.g., pixel P1, P2, or P3. In this case, the hydrophilic property in the bottom surface of the second bank 420, contacting the emission layers 510, 520, and 530, may be favorable to spreadability improvement of the emission layers 510, 520, and 530 in each individual pixel, e.g., pixel P1, P2, or P3.

Figure 11:
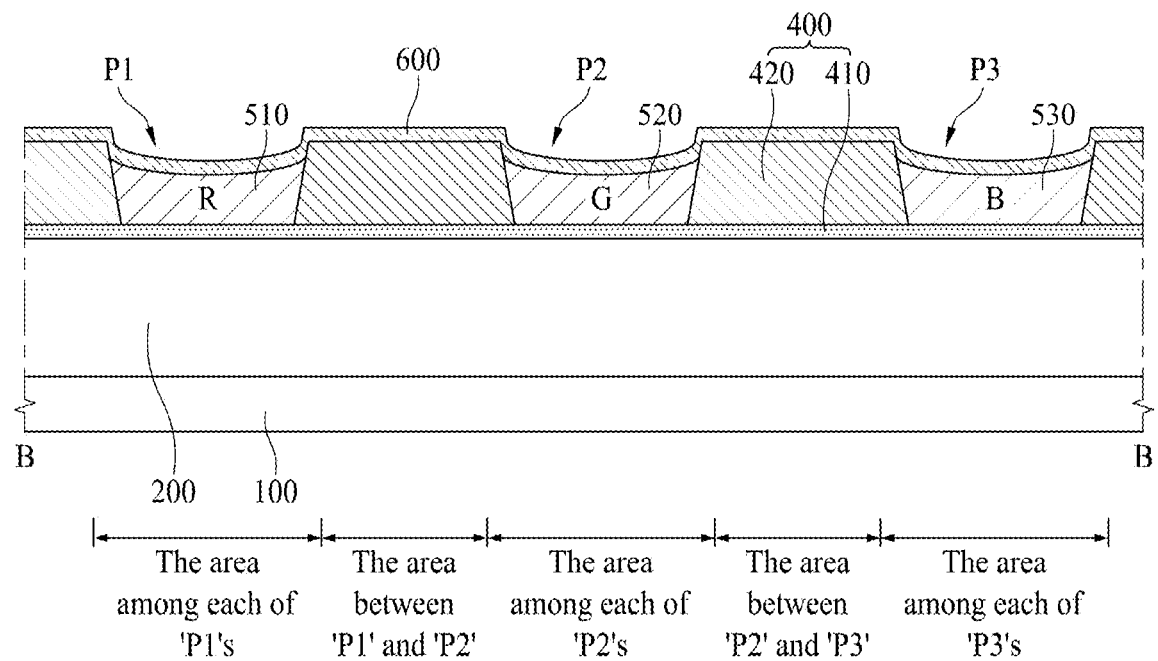
FIG. 11 is a cross-sectional view illustrating a structure of the electroluminescent display device according to another example embodiment of the present disclosure, taken along line B-B of FIG. 8.

FIG. 11 is a cross-sectional view illustrating a structure of the electroluminescent display device according to another example embodiment of the present disclosure, taken along line B-B of FIG. 8.

FIG. 11 corresponds to the cross-section that shows the line laterally passing the pixel columns C1, C2, and C3 for emitting the different-colored light and the area between each of the pixels P1, P2, and P3 for emitting the same-colored light. Except for a width of a second bank 420 may be relatively increased, the structure of FIG. 11 may be substantially similar to the structure of FIG. 6, whereby the same reference numbers will be used throughout the drawings to refer to the same parts, and a detailed description for the same parts will be omitted.

Figure 12:
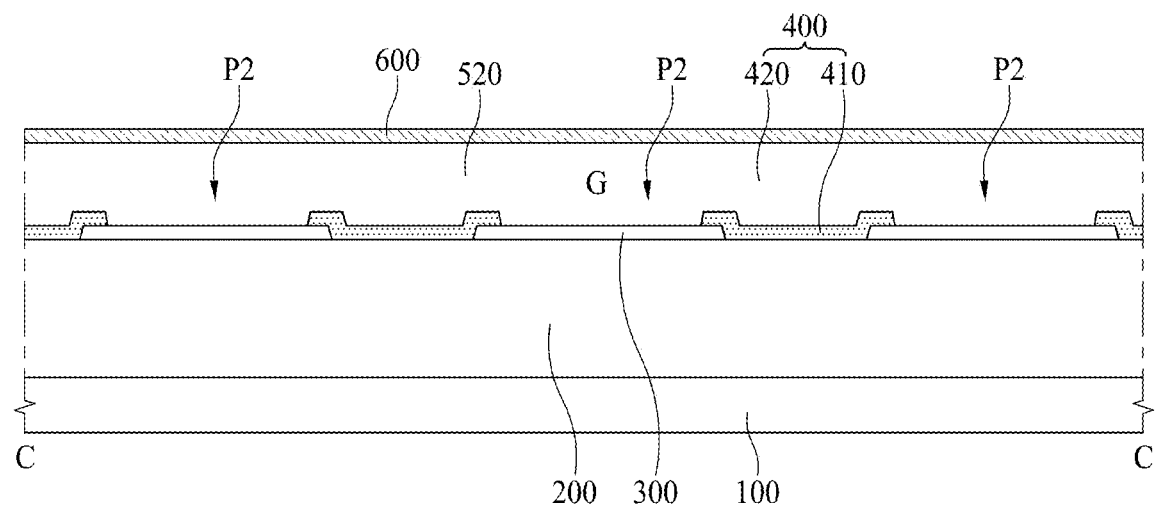
FIG. 12 is a cross-sectional view illustrating a structure of the electroluminescent display device according to another example embodiment of the present disclosure, taken along line C-C of FIG. 8.

FIG. 12 is a cross-sectional view illustrating a structure of the electroluminescent display device according to another example embodiment of the present disclosure, taken along line C-C of FIG. 8.

FIG. 12 corresponds to the cross-section of the line that may longitudinally pass the second pixels P2 for emitting the same-colored light. The structure of FIG. 12 may be substantially similar to the structure of FIG. 7, whereby the same reference numbers will be used throughout the drawings to refer to the same parts, and a detailed description for the same parts will be omitted.

Figure 13:
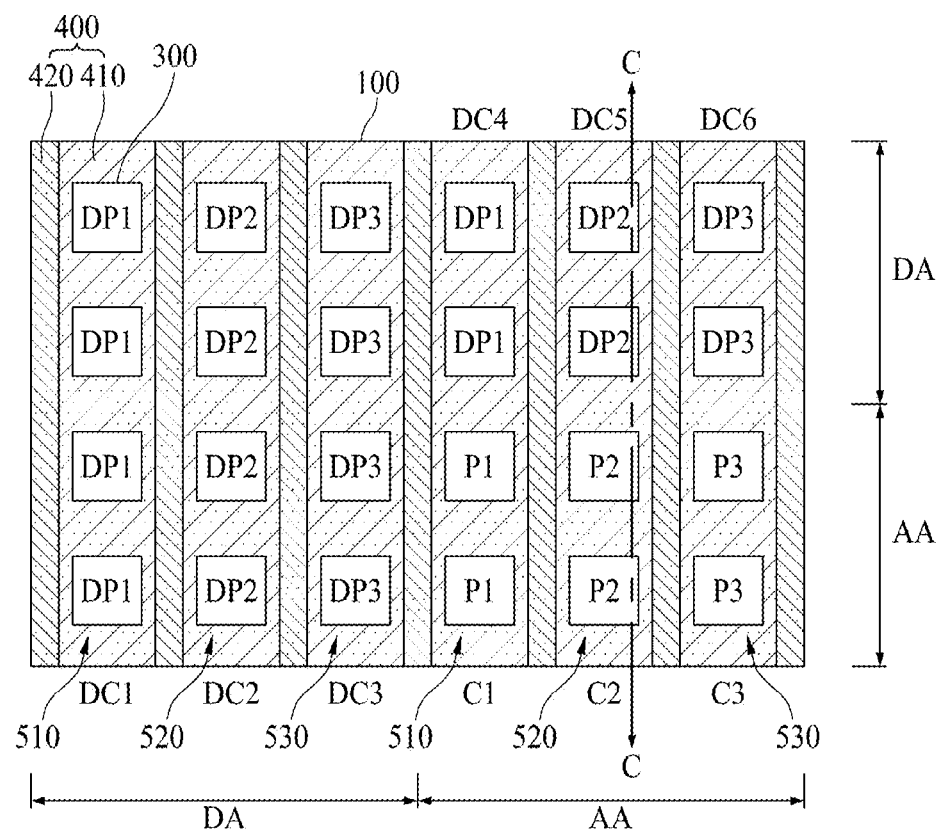
FIG. 13 is an enlarged plane view illustrating an electroluminescent display device according to further another embodiment of the present disclosure.

FIG. 13 is an enlarged plane view illustrating an electroluminescent display device according to further another embodiment of the present disclosure.

FIG. 13 shows an active area AA and a dummy area DA of FIG. 2. For example, FIG. 13 illustrates a left upper portion of a substrate 100 shown in FIG. 2. As shown in FIG. 13, the active area AA may be provided on the substrate 100, and the dummy area DA may be provided in the periphery of the active area AA.

A plurality of first pixels P1, a plurality of second pixels P2, and a plurality of third pixels P3 may be provided in the active area AA. A bank 400 may be provided between each of the plurality of pixels P1, P2, and P3.

The pixels for emitting the same-colored light may be provided at first particular intervals, and may be arranged in the same pixel column. The pixels for emitting the different-colored light may be provided at second particular intervals, and may be respectively arranged in the different pixel columns.

A first bank 410 in the active area AA may be provided between each of the plurality of pixel columns C1, C2, and C3, and may be also provided between each of the plurality of first pixels P1, between each of the plurality of second pixels P2, and between each of the plurality of third pixels P3 in the same pixel column, e.g., column C1, C2, or C3. A second bank 420 in the active area AA may be provided between each of the plurality of pixel columns C1, C2, and C3. However, the second bank 420 may be not provided between each of the plurality of first pixels P1, between each of the plurality of second pixels P2, and between each of the plurality of third pixels P3 in the same pixel column, e.g., column C1, C2, or C3.

A first emission layer 510 formed in the active area AA may be provided in each of the plurality of first pixels P1, and may also be provided between each of the plurality of first pixels P1. As a result, the first emission layer 510 may be formed in a continuous structure along an extending direction of the first pixel column C1.

A second emission layer 520 formed in the active area AA may be provided in each of the plurality of second pixels P2, and may also be provided between each of the plurality of second pixels P2. Therefore, the second emission layer 520 may be formed in a continuous structure along an extending direction of the second pixel column C2.

A third emission layer 530 formed in the active area AA may be provided in each of the plurality of third pixels P3, and may also be provided between each of the plurality of third pixels P3. Therefore, the third emission layer 530 may be formed in a continuous structure along an extending direction of the third pixel column C3. The structure of the active area AA can be varied as shown in FIGS. 3 to 12, and a repetitive description for the structure of the active area AA will be omitted.

A plurality of first dummy pixels DP1, a plurality of second dummy pixels DP2, and a plurality of third dummy pixels DP3 may be provided in the dummy area DA. A bank 400 may be provided between each of the plurality of dummy pixels DP1, DP2, and DP3.

Some of the plurality of first dummy pixels DP1 may be aligned in a first dummy pixel column DC1. For example, the plurality of first dummy pixels DP1, which may be positioned out of the dummy pixel columns DC4, DC5, and DC6 extending from the pixel column, e.g., column C1, C2, or C3, while being parallel to the pixel columns C1, C2, and C3 of the active area AA, may be aligned in a first dummy pixel column DC1.

Also, some of the plurality of first dummy pixels DP1 may be aligned together with the plurality of first pixels P1. For example, the plurality of first dummy pixels DP1, which may be arranged in the fourth dummy pixel column DC4 extending from the first pixel column C1 while being parallel to the first pixel column C1 of the active area AA, may be aligned together with the plurality of first pixels P1.

Some of the plurality of second dummy pixels DP2 may be aligned in a second dummy pixel column DC2. For example, the plurality of second dummy pixels DP2, which may be positioned out of the dummy pixel columns DC4, DC5, and DC6 extending from the pixel column, e.g., column C1, C2, or C3 while being parallel to the pixel columns C1, C2, and C3 of the active area AA, may be aligned in a second dummy pixel column DC2.

Also, some of the plurality of second dummy pixels DP2 may be aligned together with the plurality of second pixels P2. For example, the plurality of second dummy pixels DP2, which may be arranged in the fifth dummy pixel column DC5 extending from the second pixel column C2 while being parallel to the second pixel column C2 of the active area AA, may be aligned together with the plurality of second pixels P2.

Some of the plurality of third dummy pixels DP3 may be aligned in a third dummy pixel column DC3. For example, the plurality of third dummy pixels DP3, which may be positioned out of the dummy pixel columns DC4, DC5, and DC6 extending from the pixel column, e.g., column C1, C2, or C3, while being parallel to the pixel columns C1, C2, and C3 of the active area AA, may be aligned in a third dummy pixel column DC3.

Also, some of the plurality of third dummy pixels DP3 may be aligned together with the plurality of third pixels P3. For example, the plurality of third dummy pixels DP3, which may be arranged in the sixth dummy pixel column DC6 extending from the third pixel column C3 while being parallel to the third pixel column C3 of the active area AA, may be aligned together with the plurality of third pixels P3.

A first bank 410 in the dummy area DA may be provided between each of the plurality of dummy pixel columns DC1, DC2, DC3, DC4, DC5, and DC6, and may also be provided between each of the plurality of dummy pixels DP1, DP2, and DP3 in the same dummy pixel column, e.g., column DC1, DC2, DC3, DC4, DC5, or DC6. For example, the first bank 410 may be formed in a matrix configuration between each of the plurality of dummy pixels DP1, DP2, and DP3 inside the dummy area DA.

A second bank 420 formed in the dummy area DA may be provided between each of the plurality of dummy pixel columns DC1, DC2, DC3, DC4, DC5, and DC6. However, the second bank 420 may be not provided between each of the first dummy pixels DP1, between each of the plurality of second dummy pixels DP2, and between each of the plurality of third dummy pixels DP3 in the same dummy pixel column, e.g., column DC1, DC2, DC3, DC4, DC5, or DC6.

For example, the second bank 420 between each of the fourth to sixth dummy pixel columns DC4, DC5, and DC6 may be connected with the second bank 420 in the active area AA. For example, the second bank 420 between each of the plurality of pixel columns C1, C2, and C3 may extend from the active area AA to the dummy area DA.

A first emission layer 510 formed in the dummy area DA, for example, a first emission layer 510 formed in the first dummy pixel column DC1, may be provided in each of the plurality of first dummy pixels DP1, and may also be provided between each of the plurality of first dummy pixels DP1. Therefore, the first emission layer 510 may be formed in a continuous structure along an extending direction of the first dummy pixel column DC1, for example, a continuous straight-line structure.

A first emission layer 510 in the dummy area DA, for example, a first emission layer 510 in the fourth dummy pixel column DC4 may be continually connected with the first emission layer 510 in the active area AA. For example, the first emission layer 510 in the first pixel column C1 may extend from the active area AA to the dummy area DA. Therefore, the first emission layer 510 may be formed in a continuous structure from the active area AA to the dummy area DA along an extending direction of the first pixel column C1 and the fourth dummy pixel column DC4, for example, a continuous straight-line structure.

A second emission layer 520 formed in the dummy area DA, for example, a second emission layer 520 in the second dummy pixel column DC2, may be provided in each of the plurality of second dummy pixels DP2, and may also be provided between each of the plurality of second dummy pixels DP2. Therefore, the second emission layer 520 may be formed in a continuous structure along an extending direction of the second dummy pixel column DC2, for example, a continuous straight-line structure.

A second emission layer 520 formed in the dummy area DA, for example, a second emission layer 520 in the fifth dummy pixel column DC5, may be connected with the second emission layer 520 in the active area AA. For example, the second emission layer 520 in the second pixel column C2 may extend from the active area AA to the dummy area DA. Therefore, the second emission layer 520 may be formed in a continuous structure from the active area AA to the dummy area DA along an extending direction of the second pixel column C2 and the fifth dummy pixel column DC5, for example, a continuous straight-line structure.

A third emission layer 530 in the dummy area DA, for example, a first emission layer 510 in the third dummy pixel column DC3, may be provided in each of the plurality of third dummy pixels DP3, and may also be provided between each of the plurality of third dummy pixels DP3. Therefore, the third emission layer 530 may be formed in a continuous structure along an extending direction of the third dummy pixel column DC3, for example, a continuous straight-line structure.

A third emission layer 530 in the dummy area DA, for example, a third emission layer 530 in the sixth dummy pixel column DC6, may be connected with the third emission layer 530 in the active area AA. For example, the third emission layer 530 provided in the third pixel column C3 may extend from the active area AA to the dummy area DA. Therefore, the third emission layer 530 may be formed in a continuous structure from the active area AA to the dummy area DA along an extending direction of the third pixel column C3 and the sixth dummy pixel column DC6, for example, a continuous straight-line structure.

The structure of each of the first bank 410, the second bank 420, the first emission layer 510, the second emission layer 520, and the third emission layer 530 in the active area AA may be substantially similar to the structure of each of the first bank 410, the second bank 420, the first emission layer 510, the second emission layer 520, and the third emission layer 530 in the dummy area DA. As such, the aforementioned elements may be manufactured both in the active area AA and the dummy area DA by the same process.

Figure 14:
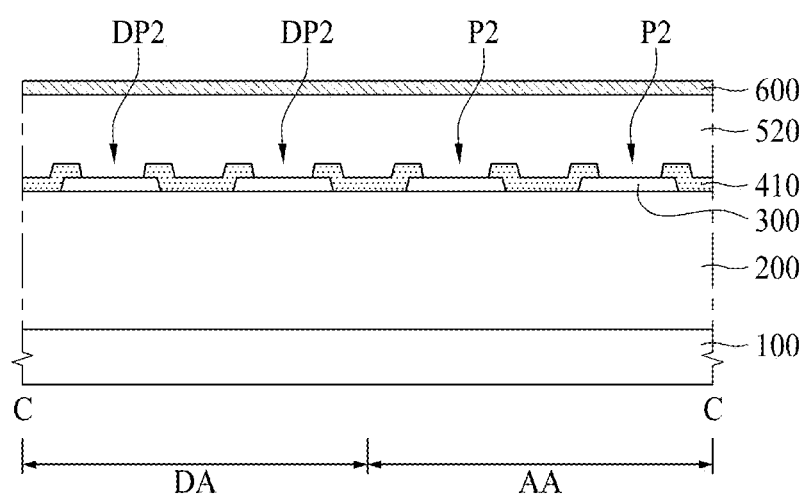
FIG. 14 is a cross-sectional view illustrating a structure of the electroluminescent display device according to further another embodiment of the present disclosure, taken along line C-C of FIG. 13.

FIG. 14 is a cross-sectional view illustrating a structure of the electroluminescent display device according to further another embodiment of the present disclosure, taken along line C-C of FIG. 13.

FIG. 14 corresponds to the cross-section of the line that traverses the second pixel column C2. As shown in FIG. 14, a circuit device layer 200, a first electrode 300, a first bank 410, a second emission layer 520, and a second electrode 600 may be formed on a substrate 100. Herein, the structure of the active area AA may be the same as that of FIG. 7, and a detailed description for the same parts will be omitted.

On the dummy area DA of the substrate 100, there may be a circuit device layer 200, a first electrode 300, a first bank 410, a second emission layer 520, and a second electrode 600. The circuit device layer 200 in the dummy area DA may be substantially similar in structure to the circuit device layer 200 in the active area AA, and the circuit device layer 200 in the dummy area DA and the circuit device layer 200 in the active area AA may be manufactured by the same process, but not necessarily. For example, some of signal lines, such as a gate line, a data line, a power line, and a reference line, may be not included in the circuit device layer 200 in the dummy area DA, or some of a switching thin film transistor and a driving thin film transistor may be not included in the circuit device layer 200 in the dummy area DA, whereby a light emission may be not generated in the dummy area DA. If needed, the circuit device layer 200 in the dummy area DA may be configured incompletely to not operate any one of the switching thin film transistor and the driving thin film transistor.

The first electrode 300 in the dummy area DA may be substantially similar in structure to the first electrode 300 in the active area AA, and the first electrode 300 in the dummy area DA and the circuit first electrode 300 in the active area AA may be manufactured by the same process, although embodiments are not limited thereto. The first electrode 300 may be not formed in the dummy area DA, whereby a light emission may be not generated in the dummy area DA. If desired, the first electrode 300 in the dummy area DA may be not connected with the driving thin film transistor included in the circuit device layer 200, whereby a light emission may be not generated in the dummy area DA.

The first bank 410 in the dummy area DA may be substantially similar in structure to the first bank 410 in the active area AA. As such, the first bank 410 in the dummy area DA and the first bank 410 in the active area AA may be manufactured by the same process.

The second emission layer 520 in the dummy area DA may be substantially similar to the second emission layer 520 in the active area AA. As such, the second emission layer 520 in the dummy area DA and the second emission layer 520 in the active area AA may be manufactured by the same process. The second emission layer 520 in the dummy area DA may be connected with the second emission layer 520 in the active area AA.

The second electrode 600 in the dummy area DA may extend from the second electrode 600 in the active area AA. However, the second electrode 600 may not be formed in the dummy area DA, whereby a light emission may be not generated in the dummy area DA.

According to example embodiments of the present disclosure, the emission layer formed in the pixel column may easily spread to the area between each of the plurality of pixels for emitting the same-colored light in the pixel column so that it may be possible to decrease the difference between a drying speed of the emission layer in the central portion of the active area and a drying speed of the emission layer in the peripheral portion of the active area. In addition to the effects of example embodiments of the present disclosure as mentioned above, additional advantages and features of the present disclosure will be clearly understood by those skilled in the art from the above description of the present disclosure.

The various embodiments described above can be combined to provide further embodiments. Any and all of the U.S. patents, U.S. patent application publications, U.S. patent applications, foreign patents, foreign patent applications and non-patent publications referred to in this specification and/or listed in the corresponding Application Data Sheet are incorporated herein by reference, in their entirety. Aspects of the embodiments can be modified, if necessary to employ concepts of the various patents, applications and publications to provide yet further embodiments.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An electroluminescent display device, comprising:
   a substrate;
   a first pixel column on the substrate, the first pixel column comprising:
      a plurality of first pixels configured to emit light of a first color; and
      a first emission layer;
   a second pixel column on the substrate, the second pixel column comprising:
      a plurality of second pixels configured to emit light of a second color; and
      a second emission layer;
   a first bank extending between the first pixel column and the second pixel column, between each of the plurality of first pixels, and between each of the plurality of second pixels; and
   a second bank extending between the first pixel column and the second pixel column on each first bank,
   wherein a height of the second bank is higher than a height of the first bank.

2. The electroluminescent display device of claim 1, wherein the first emission layer is in each of the plurality of first pixels, and between each of the plurality of first pixels.

3. The electroluminescent display device of claim 1, wherein the first emission layer comprises a continuous structure along an extending direction of the first pixel column.

4. The electroluminescent display device of claim 1, further comprising:
   a third pixel column on the substrate, the third pixel column comprising a plurality of third pixels configured to emit light of a third color,
   wherein the first bank further extends between the second pixel column and the third pixel column and between each of the plurality of third pixels, and wherein each second bank has a stripe structure between the second pixel column and the third pixel column.

5. The electroluminescent display device of claim 1, wherein:
the first emission layer contacts an upper surface of the first bank between each of the plurality of first pixels; and
the second emission layer contacts an upper surface of the first bank between each of the plurality of second pixels.

6. The electroluminescent display device of claim 1, wherein:
each of the plurality of first pixels and each of the plurality of second pixels comprises a first electrode below the first bank;
the first bank covers an end of the first electrode; and
the second bank partially overlaps exposed portions of the first electrode, without being covered by the first bank.

7. The electroluminescent display device of claim 1, wherein, between the first pixel column and the second pixel column, a width of the first bank is smaller than a width of the second bank.

8. The electroluminescent display device of claim 1, wherein one entire lateral surface of the first emission layer contacts the second bank.

9. The electroluminescent display device of claim 1, wherein a height of an upper end of the first emission layer in the center of the plurality of first pixels is lower than a height of an upper end of the first emission layer in the end of the plurality of first pixels that contacts the second bank.

10. An electroluminescent display device, comprising:
a substrate;
a first pixel column on the substrate, the first pixel column comprising a plurality of first pixels configured to emit light of a first color;
a second pixel column on the substrate, the second pixel column comprising a plurality of second pixels configured to emit light of a second color; and
a bank extending between the first pixel column and the second pixel column, between each of the plurality of first pixels, and between each of the plurality of second pixels,
wherein a height of the bank between the first pixel column and the second pixel column is higher than a height of the bank between each of the plurality of first pixels.

11. The electroluminescent display device of claim 10, further comprising:
a first emission layer having a continuous structure along an extending direction of the first pixel column; and
a second emission layer having a continuous structure along an extending direction of the second pixel column.

12. The electroluminescent display device of claim 10, wherein:
the bank extending between the first pixel column and the second pixel column comprises:
a first bank; and
a second bank on the first bank; and
the bank extending between each of the plurality of first pixels comprises a same material as the first bank.

13. The electroluminescent display device of claim 12, wherein:
each of the plurality of first pixels and each of the plurality of second pixels comprises a first electrode below the first bank;
the first bank covers an end of the first electrode; and
the second bank partially overlaps exposed portions of the first electrode, without being covered by the first bank.

14. The electroluminescent display device of claim 12, wherein, between the first pixel column and the second pixel column, a width of the first bank is smaller than a width of the second bank.

15. The electroluminescent display device of claim 12, wherein one entire lateral surface of the first emission layer contacts the second bank.

16. An electroluminescent display device, comprising:
a substrate comprising:
an active area; and
a dummy area;
a first column comprising:
a plurality of first pixels in the active area; and
a plurality of first dummy pixels in the dummy area;
a second column comprising:
a plurality of second pixels in the active area; and
a plurality of second dummy pixels in the dummy area;
a first emission layer in the first column;
a second emission layer in the second column; and
a bank extending between the first column and the second column, between each of the plurality of first dummy pixels, and between each of the plurality of second dummy pixels,
wherein a height of the bank between the first column and the second column is higher than a height of the bank between each of the plurality of first dummy pixels,
wherein the first emission layer has a continuous structure from the active area to the dummy area along an extending direction of the first column, and
wherein the second emission layer has a continuous structure from the active area to the dummy area along an extending direction of the second column.

17. The electroluminescent display device of claim 16, wherein:
the bank extending between the first column and the second column comprises:
a first bank; and
a second bank on the first bank; and
the bank extending between each of the plurality of first dummy pixels comprises a same material as the first bank.

* * * * *